United States Patent
Sato

(10) Patent No.: US 7,334,929 B2
(45) Date of Patent: Feb. 26, 2008

(54) METHOD OF PRODUCING MULTICOLOR PIXEL SHEET AND COLOR FILTER USING THE SAME

(75) Inventor: Morimasa Sato, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 1030 days.

(21) Appl. No.: 10/237,029

(22) Filed: Sep. 9, 2002

(65) Prior Publication Data

US 2003/0072017 A1 Apr. 17, 2003

(30) Foreign Application Priority Data

Sep. 11, 2001 (JP) .............................. 2001-274783

(51) Int. Cl.
*F21V 7/04* (2006.01)

(52) U.S. Cl. ...................... 362/602; 362/618; 362/561; 349/80

(58) Field of Classification Search ................ 362/602, 362/618, 561; 349/80
See application file for complete search history.

(56) References Cited

FOREIGN PATENT DOCUMENTS

| JP | 5-196946 | 6/1993 |
|---|---|---|
| JP | 11-014823 | 1/1999 |
| JP | 2000-314804 | 11/2000 |

*Primary Examiner*—Twyler Lamb
*Assistant Examiner*—Vu Hang
(74) *Attorney, Agent, or Firm*—Sughrue Mion, PLLC

(57) ABSTRACT

The present invention is a method of producing a multicolor pixel sheet on which pixels of different colors (R, G and B) and a black matrix are formed. Pixels are formed with a gap therebetween on a light-transmitting substrate and each pixel is composed of a coloring layer. The black matrix is formed by a black coloring resin provided at upper surfaces of pixels on the pixel sheet, the gap between the pixels, and the outer periphery defined by the outermost pixels. A two-stage developing process is conducted after exposure from the back and the front of the substrate to form a spacer pattern having a predetermined thickness on the black matrix.

11 Claims, 2 Drawing Sheets

METHOD OF PRODUCING MULTICOLOR PIXEL SHEET AND COLOR FILTER USING THE SAME

BACKGROUND OF THE INVENTION

1. Field of the Invention

The present invention relates to a method of producing a multicolor pixel sheet and a color filter using the same, and in particular, to a color filter with a black matrix that has a light-shielding film with high optical density and serves as a spacer, and a method of simply and accurately producing a multicolor pixel sheet suited for producing the color filter.

2. Description of the Related Art

In a conventional liquid crystal display, two substrates, i.e., a color filter substrate and a counter electrode substrate, are laminated with spacer beads, such as plastic beads and ceramic beads having a predetermined diameter, dispersed therebetween to keep the thickness of a liquid crystal layer (cell gap) constant. However, because it is difficult to disperse the spacer beads regularly, the cell gap cannot be kept completely constant over the display area. When the number of the spacer beads is increased, the cell gap can be constant, but aperture ratio of the display area is undesirably lowered because of the spacers disposed at the display area. Further, the spacer beads may damage an orientation film or transparent electrodes when the two substrates are laminated together, and may thereby cause display defects.

To solve this problem, Japanese Patent Application Laid-Open (JP-A) No. 5-196946 discloses spacers formed by stacking two or three coloring layers of a color filter substrate. In these applications, each coloring layer must have sufficient and precise thickness to form spacers which have a height corresponding to the desired cell gap. JP-A No. 2000-314804 discloses a method of producing a black matrix and spacers by exposing the substrate from both the upper and lower surfaces of the substrate. This method utilizes a conventional development method using a conventional photosensitive black resin. However, the optical density of the obtained black matrix is 2.5 at most, which is below the required optical density of 3.5 or more. JP-A No. 11-14823 discloses a method of producing a black matrix having high optical density by exposing the substrate only from the lower surface thereof. In this method, although a black matrix with high optical density may be obtained, the thickness of the obtained black matrix is the same as those of the spacers, which may cause an undesirable liquid crystal domain and make it difficult to inject liquid crystal.

SUMMARY OF THE INVENTION

The present invention was devised to overcome the aforementioned problems. It is an object of the invention to provide a method of producing a multicolor pixel sheet with a black matrix that includes a light-shielding film with high optical density and functions as a spacer, and a color filter produced by this method.

The object is achieved by a color filter with a plurality of coloring layers each having one of three primary colors and a black matrix shielding light and serving as a spacer, which are provided on a transparent substrate. A method for producing a multicolor pixel sheet having the black matrix comprises the steps of:

preparing a pixel sheet in which pixels of different colors are formed with a gap therebetween on a light-transmitting sheetlike substrate, each pixel composed of a coloring layer;

covering upper surfaces of the pixels, the gap between the pixels, and an outer periphery defined by the outermost pixels with a photosensitive black resin layer composed of a photosensitive resin composition;

exposing the pixel sheet to light from the side of the substrate opposite to the side disposed with the photosensitive black resin layer, to cure at least a lower portion of the photosensitive black resin layer at the gap between the pixels and at the outer periphery defined by the outermost pixels;

exposing, via a photo mask, the pixel sheet to light from the side of the substrate disposed with the photosensitive black resin layer, to cure the photosensitive black resin layer at a part of the gap between the pixels and the outer periphery defined by the outermost pixels;

developing the exposed pixel sheet to remove uncured portions of the photosensitive black resin layer;

developing the obtained pixel sheet to reduce film thickness of the black resin layer at the gap between the pixels and the outer periphery defined by the outermost pixels; and heating the pixel sheet having the developed black resin layer to further cure the black resin layer.

In the present invention, when the photosensitive black resin composition layer obtained in the step of preparing a pixel sheet is exposed to light from the transparent substrate side, each pixel functions as a light-shielding film, and at least boundary areas of the photosensitive black resin composition layer at the circumferences of the pixels and the transparent substrate are photo-cured. Then, by exposing selected portions of the photosensitive black resin composition layer (e.g., portions at which the spacers are to be formed) to light from the photosensitive black resin composition layer side, surfaces of the exposed portions are photo-cured. Through a predetermined developing process, the photosensitive black resin composition layer on the pixels is removed. Accordingly, the photosensitive black resin composition layer remains in the circumferences of the pixels and the spacers. Therefore, a black matrix which shields light and serves as the spacer can be produced in a simplified and accurate manner.

In the color filter of the present invention, the black matrix shields light and serves as the spacer. Accordingly, compared with spacers formed by stacking coloring layers, the spacers of the present invention can be of the uniform height. With the black matrix, uniform liquid crystal layers can be formed easily and, as a result, a color filter which is excellent in display quality with no uneven brightness or color can be obtained. Further, in accordance with the method of producing the multicolor pixel sheet of the present invention, a color filter having the aforementioned characteristics can be produced in a simplified and accurate manner.

DESCRIPTION OF THE PREFERRED EMBODIMENT

Figure 1A:
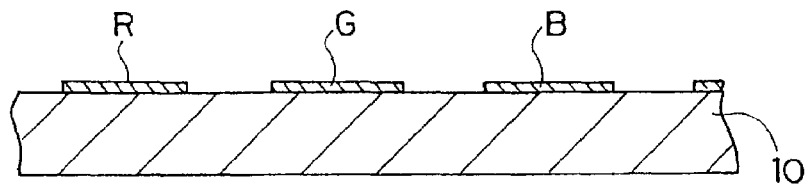
FIGS. 1A through 1D are sectional views illustrating steps in a preferred embodiment of a method of producing a multicolor pixel sheet of the present invention.

Hereinafter, a preferred embodiment of the present invention will be described. Referring to drawings, a method for producing a multicolor pixel sheet of the present invention will be explained. As shown in FIG. 1A, red (R), green (G) and blue (B) pixels are formed on a surface of a transparent substrate 10.

Known substrates for color filters can be used as the substrate 10. Namely, glass, such as quartz glass, Pyrex® glass and synthetic quartz glass, transparent resin films and optical resin plates may be used. There are no limitations on how the R, G and B pixels are formed on the surface of the substrate 10, and the pixels may be formed by known methods, such as using photosensitive resin compositions having dispersed therein colorants of the different colors, printing, electrodeposition, and electrolesss plating. However, in view of simplicity and evenness in the thickness of the obtained pixels, it is preferable to dispose the pixels on the substrate 10 using a transfer material comprising a temporary support having disposed thereon photosensitive resin composition layers, each containing a colorant of a different color.

Figure 1B:
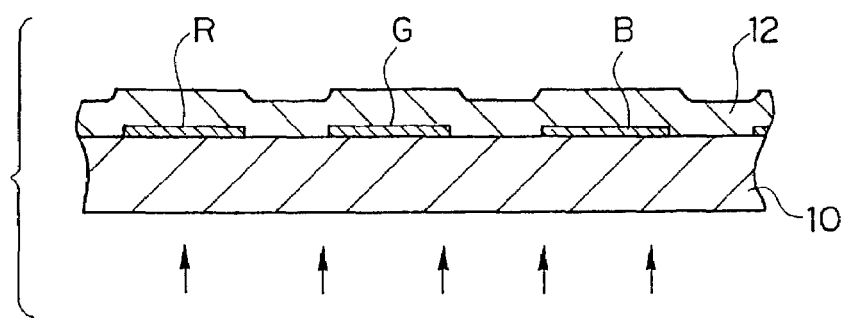

Next, as shown in FIG. 1B, a photosensitive black resin composition layer 12 is provided on the entire surface of the transparent substrate 10 on which the respective pixels have been formed. The photosensitive black resin composition that forms the layer 12 may preferably include an alkali-soluble binder polymer, a photopolymerization initiator, an addition-polymerizable monomer having an ethylenical unsaturated double bond, and a light-shielding agent.

The alkali-soluble binder polymer used in the invention typically has an acid number of 50 to 300 mgKOH/g and a weight-average molecular weight of 1,000 to 300,000. When development in which unnecessary portions are removed in the form of a film is conducted, a polymer having an acid number of 50 to 100 mgKOH/g is preferably used. When the acid number is less than 50 mgKOH/g, alkali-developability is significantly lowered. When the acid number exceeds 300 mgKOH/g, it becomes difficult to obtain a light-shielding image of high density. The weight-average molecular weight of the binder is preferably 1,000 to 300,000, and more preferably 10,000 to 250,000. When the weight-average molecular weight is less than 1,000, it becomes difficult to obtain a light-shielding image of high density. When the weight-average molecular weight exceeds 300,000, developability is extremely lowered. Two or more alkali-soluble binder polymers may be used in combination.

To improve performance, such as cured film strength, an alkali-insoluble polymer may also be added to the photosensitive black resin composition as long as it does not adversely effect, for example, the developability of the photosensitive black resin composition. Examples of such polymers include alcohol-soluble nylon or epoxy resin.

The content of the binder is from 10 to 95% by weight (wt %), and more preferably from 20 to 90 wt %, based on the total solid content of the photosensitive black resin composition. When the content of the binder is less than 10 wt %, adhesiveness of the photosensitive resin layer becomes too high. When the content of the binder exceeds 95 wt %, strength and photosensitivity of the image become insufficient.

Examples of the photopolymerization initiator include the vicinal polyketaldonyl compound disclosed in U.S. Pat. No. 2,367,660, the acyloin ether compound disclosed in U.S. Pat. No. 2,448,828, the aromatic acyloin compound substituted by α-hydrocarbon disclosed in U.S. Pat. No. 2,722,512, the polynuclear quinone compound disclosed in U.S. Pat. Nos. 3,046,127 and 2,951,758, the combination of triaryl imidazole dimer and p-aminoketone disclosed in U.S. Pat. No. 3,549,367, the benzothiazole compound and the trihalomethyl-s-triazine compound disclosed in Japanese Patent Application Publication (JP-B) No. 51-48516, the trihalomethyl-s-triazine compound disclosed in U.S. Pat. No. 4,239,850, and the trihalomethyl oxadiazole compound disclosed in U.S. Pat. No. 4,212,976. Among these, trihalomethyl-s-triazine, trihalomethyl oxadiazole and triaryl imidazole dimer are particularly preferable. The amount of the photopolymerization initiator is generally from 0.5 to 20 wt %, and preferably from 1 to 15 wt %, based on the total solid content of the photosensitive resin composition. When the amount is less than 0.5 wt %, photosensitivity and strength of the image become insufficient. When the amount exceeds 20 wt %, no effect is exhibited with respect to improved performance.

Examples of monomers that have an ethylenical unsaturated double bond and are addition-polymerizable due to light irradiation include compounds that have in the molecules thereof at least one addition-polymerizable ethylenical unsaturated group and that have a boiling point of 100° C. or more under normal pressure. Namely, monofunctional acrylate and monofunctional methacrylate, such as polyethylene glycol mono(meth)acrylate, polypropylene glycol mono(meth)acrylate and phenoxyethyl (meth)acrylate; polyethylene glycol di(meth)acrylate, polypropylene glycol di(meth)acrylate, trimethylolethane triacrylate, trimethylolpropane triacrylate, trimethylolpropane diacrylate, neopentylglycol di(meth)acrylate, pentaerithritol tetra(meth)acrylate, pentaerithritol tri(meth)acrylate, dipentaerithritol hexa(meth)acrylate, dipentaerithritol penta(meth)acrylate, hexanediol (meth)acrylate, trimethylolpropane tri(acryloyloxypropyl) ether, tri(acryloyloxyethyl) isocyanurate, tri(acryloyloxyethyl) cyanurate and glycerine tri(meth)acrylate; and multifunctional acrylate and multifunctional methacrylate such as, that obtained by addition-reacting multifunctional alcohol such as trimethylolpropane and glycerine with ethylene oxide or propylene oxide and then reacting the resultant compound with methacrylic acid may be used.

In addition, the urethane acrylates disclosed in JP-B Nos. 48-41708, 50-6034 and JP-A No. 51-37193; the polyester acrylates disclosed in JP-A No. 48-64183, JP-B Nos. 49-43191 and 52-30490; and multifunctional acrylates and methacrylates, such as epoxyacrylates, which are reaction products of epoxy resin and (meth)acrylic acid, can also be used. Among these, trimethylolpropane tri(meth)acrylate, pentaerithritol tetra(meth)acrylate, dipentaerithritol hexa(meth)acrylate, and dipentaerithritol penta(meth)acrylate are preferable. The monomer having an ethylenical unsaturated double bond that is addition-polymerizable due to light irradiation may be used alone or in combination with two or more types thereof. The amount of the addition-polymerizable monomer is generally 5 to 50 wt %, and preferably 10 to 40 wt %, based on the total solid content of the photosensitive resin composition. When the amount is less than 5 wt %, photosensitivity and strength of the image become insufficient. When the amount exceeds 50 wt %, adhesiveness of the photosensitive resin layer becomes excessive, which is unpreferable.

It is preferable that the photosensitive black resin composition includes at least one colorant. The various colorants disclosed in Japanese Patent Application No. 5-110487 may be used. Carbon black is particularly preferable from the viewpoint of optical characteristics. Examples of the carbon black include: SEAST 5HIISAF-HS, SEAST KH, SEAST 3HHAF-HS, SEAST NH, SEAST 3HAF, SEAST 3M, SEAST N, SEAST 300HAF-LS, SEAST 116HMMAF-HS, SEAST 116MAF, SEAST FMFEF-HS, SEAST SOFEF, SEAST VGPF, SEAST SVHSRF-HS and SEAST SSRF (products of Tokai Carbon Co., Ltd.); HTC#100, HTC#G, HTC#S, HTC#SL and HTC#20 (products of Chubu Carbon Co., Ltd.); ASAHI #70, ASAHI #70L, ASAHI #F-200, ASAHI #66, ASAHI #60NH, ASAHI #60H, ASAHI #60U, ASAHI #60, ASAHI #55, ASAHI #50H, ASAHI #51, ASAHI #50U, ASAHI #35, ASAHI #15, ASAHI THERMAL and ASAHI #S-500 (products of Asahi Carbon Co., Ltd.); NITERON #75, NITERON #55, NITERON #55S, NITERON #55U, NITERON #10S, NITERON #10, NITERON #10H, NITERON #2001N, NITERON #200, NITERON #200H and NITERON #2001S (products of Nippon Steel Chemical Co., Ltd.); DIABLACK II, DIABLACK N339, DIABLACK SH, DIABLACK H, DIABLACK LH, DIABLACK HA, DIABLACK SF, DIABLACK N550M, DIABLACK M, DIABLACK E, DIABLACK G, DIABLACK R, DIABLACK N760M, DIABLACK LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, OIL7B, OIL9B, OIL11B OIL30B and OIL31B (products of Mitsubishi Chemical Corporation); DENKA BLACK HS100 (a product of Denki Kagaku Kogyo Kabushiki Kaisha); PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100 and LAMP BLACK-101 (products of Degussa Japan Co., Ltd.); RAVEN-1100 ULTRA, RAVEN-1100 ULTRA, RAVEN-1080 ULTRA, RAVEN-1060 ULTRA, RAVEN-1040, RAVEN-1035, RAVEN-1020, RAVEN-1000, RAVEN-890H, RAVEN-890, RAVEN-880 ULTRA, RAVEN-860 ULTRA, RAVEN-850, RAVEN-820, RAVEN-790 ULTRA, RAVEN-780 ULTRA, RAVEN-760 ULTRA, RAVEN-520, RAVEN-500, RAVEN-460, RAVEN-450, RAVEN-430 ULTRA, RAVEN-420, RAVEN-410, RAVEN-2500 ULTRA, RAVEN-2000, RAVEN-1500, RAVEN-1255, RAVEN-1250, RAVEN-1200, RAVEN-1190 ULTRA and RAVEN-1170 (products of Columbia Carbon Co., Ltd.); and BLACK PEARLS-3500, BLACK PEARLS-480, BLACK PEARLS-460, BLACK PEARLS-430, BLACK PEARLS-280, BLACK PEARLS-130, BLACK PEARLS-1100, MONARCH-1100, BLACK PEARLS-900, MONARCH-900, MONARCH-460, MONARCH-280, MONARCH-120, REGAL-330®, REGAL-415®, REGAL-250®, REGAL-99®, MOGUL-L, BLACK PEARLS-L, REGAL-400®, REGAL-660®, REGAL-350® and ELFTEX-8 (products of Cablack Co., Ltd.).

The content of the colorant is preferably 1 to 50 wt % based on the total solid content of the photosensitive black resin composition. In addition to carbon black, other colorants may be added to the photosensitive black resin composition in an amount of not more than 20 wt %. Examples of such colorants include known pigments and dyes of red, green, blue, yellow, purple, magenta, cyan and black. Namely, CARMINE 6B (Color Index (C.I.) 12490), PHTHALOCYANINE GREEN (C.I. 74260), PHTHALOCYANINE BLUE (C.I. 74160), MITSUBISHI CARBON BLACK MA-100, PERYLENE BLACK (BASF K0084, K0086), CYANINE BLACK, #1201 LIONOL YELLOW (C.I. 21090), LIONOL YELLOW GRO (C.I. 21090), SHIMURA-FIRST YELLOW 8GF(C.I. 21105), BENZIDINE YELLOW 4T-564D (C.I. 21095), SHIMURA-FIRST RED 4015 (C.I. 12355), LIONOL RED 7B4401 (C.I. 15850), FIRSTGEN BLUE TGR-L (C.I. 74160), LIONOL BLUE SM (C.I. 26150), MITSUBISHI CARBON BLACK MA-100, MITSUBISHI CARBON BLACK #40, VICTORIA PURE BLUE (C.I. 42595), AURAMINE O (C.I. 41000), CAROTENE BRILLIANT FLAVIN (C.I. Basic 13), RHODAMINE 6GCP (C.I. 45160), RHODAMINE B (C.I. 45170), SAFRANINE OK 70:100 (C.I. 50240), ERIOGLAUCINE X (C.I. 42080), FIRST BLACK HB (C.I. 26150), C.I. PIGMENT RED 97, C.I. PIGMENT RED 122, C.I. PIGMENT RED 149, C.I. PIGMENT RED 168, C.I. PIGMENT RED 177, C.I. PIGMENT RED 180, C.I. PIGMENT RED 192, C.I. PIGMENT RED 215, C.I. PIGMENT GREEN 7, C.I. PIGMENT GREEN 36, C.I. PIGMENT BLUE 15:1, C.I. PIGMENT BLUE 5:4, C.I. PIGMENT BLUE 15:6, C.I. PIGMENT BLUE 22, C.I. PIGMENT BLUE 60, C.I. PIGMENT BLUE 64, C.I. PIGMENT YELLOW 139, C.I. PIGMENT YELLOW 83 and C.I. PIGMENT VIOLET 23 are preferably used. In addition to the above-listed colorants, metal powder, white pigment, fluorescent pigment, and the like, may also be used. These colorants may be used alone or in combination of two or more so that the hue turns black.

Examples of combinations of the colorants include a combination of a mixture of red and blue pigments which are complementary to each other and a mixture of yellow and purple pigments which are complementary to each other, a combination of these mixtures and black pigment, and a combination of blue, purple and black pigments.

In addition to the aforementioned components, it is preferable to add a thermal-polymerization inhibitor to the photosensitive black resin composition. Examples thereof include hydroquinone, p-methoxyphenol, di-t-butyl-p-cresol, pyrogallol, t-butylcatechol, benzoquinone, 4,4'-thiobis (3-methyl-6-t-burylphenol), 2,2'-methylenebis(4-methyl-6-t-butylphenol), 2-mercaptobenzimidazole and phenothiazine.

Further, known additives, such as plasticizers, surfactants and solvents may also be added to the photosensitive black resin composition.

The photosensitive black resin composition may be applied to the substrate 10 using a spinner, whirler, roller coater, curtain coater, knife coater, wire bar coater, extruder, or the like, and then dried to form the layer 12. However, the layer 12 is preferably disposed on the substrate 10 using a photosensitive black transfer material comprising a temporary support having disposed thereon and a photosensitive black resin composition layer. Examples of the transfer material are disclosed in Japanese Patent Application Nos. 2-400047, 3-9292, 3-120223, 3-153227, 4-64870 and 5-110487.

It is preferable that the temporary support used in the transfer material is flexible, and is not easily distorted and does not shrink or expand under pressure or under pressure and heat. Examples of the temporary support include polyethylene terephthalate, a cellulose triacetate film, a polystyrene film and a polycarbonate film. Biaxial oriented polyethylene terephthalate is particularly preferable. It is preferable to dispose the photosensitive black resin composition layer on the support directly or via an intermediate layer that transmits ultraviolet light but has low oxygen transmittance. Further, a thermoplastic composition resin layer may preferably be provided to prevent the entrance of air when the photosensitive black resin composition is transferred to the surface on which the pixels have been formed. In this case, it is preferable that the temporary support, the thermoplastic composition resin layer, the intermediate layer, the photosensitive black resin composition layer are disposed in this order.

It is preferable that a cover sheet is placed over the surface of the photosensitive black resin composition layer of the transfer material before the transfer, and is removed from the photosensitive black resin composition layer after the transfer. A resin film, such as a polypropylene film, is preferably used as the cover sheet.

After the photosensitive black resin layer of the transfer material is transferred to the surface of the transparent substrate 10 on which the pixels have been formed, the photosensitive black resin layer is exposed to light from the substrate 10 side (i.e., from the side of the substrate 10 opposite to the side at which the photosensitive black resin layer is disposed; this direction is indicated by arrows in FIG. 1B). A light source for the exposure is selected in accordance with photosensitivity of the photosensitive black resin layer. Known light sources, such as an extra-high pressure mercury lamp, a xenon lamp, a carbon arc lamp and an argon laser, may be used. Exposure is conducted at a condition of 1 to 1,000 mJ/cm$^2$, and preferably 10 to 400 mJ/cm$^2$. When exposure is conducted at less than 10 mJ/cm$^2$, sufficient light-shielding capability cannot be obtained. When exposure is conducted at greater than 400 mJ/cm$^2$, a shielding film undesirably remains on the R, G or B pixels. It is preferable to set the light transmittance of each R, G or B pixel on the substrate to 2% or less in the range of the photo-sensitizing wavelengths of the layer 12, as disclosed in Japanese Patent Application No. 4-150691. When the layer 12 is exposed under such conditions, the photosensitive black resin composition layer on the pixels cannot be photo-cured because each pixel acts as a light-shielding film. Only the lower portion of the layer 12 provided directly on the surface of the transparent substrate 10 which lower portion is in the vicinity of the substrate 10 is photo-cured.

Figure 1C:
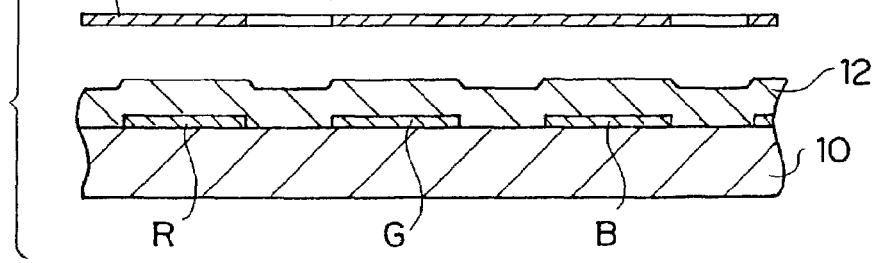
Figure 1D:
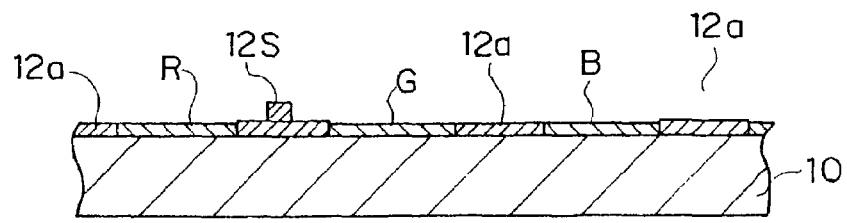

Next, as shown in FIG. 1C, by pattern-exposing the substrate 10 via a photo mask 14 from the layer 12 side (i.e., from the side of the layer 12 opposite to the side disposed on the substrate 10; this direction is indicated by arrows in FIG. 1C), areas where spacers 12S are to be formed are photo-cured. The exposure is conducted at a condition of 1 to 1,000 mJ/cm$^2$, and preferably 10 to 400 mJ/cm$^2$. When exposure is conducted at less than 10 mJ/cm$^2$, no image can be obtained. If exposure is conducted at more than 400 mJ/cm$^2$, exposure time becomes too long and productivity is lowered. After exposure, the layer 12 is developed with a developing solution A. The areas of the photosensitive black resin composition layer 12 exposed from the back side of the substrate are adhered more closely to the substrate 10 and the uncured portions of the layer 12 is removed in the form of a film without decrease in optical density. As a result, as shown in FIG. 1D, the layer 12 remains only at peripheries (light-shielding areas) 12a of the pixels and the spacers 12S. However, the thus-obtained light-shielding layers between the pixels are usually thicker than the pixels, which results in undesirable liquid crystal domain and makes liquid crystal injection difficult. By processing the substrate with the light-shielding layer with a developing solution B, the film thickness of areas that have not been exposed from the upper surface is reduced to a thickness substantially the same as that of the pixels while the optical density in these areas is maintained. Therefore, the black matrix includes portions that constitute the peripheries 12a of the pixels and shield light and portions that constitute the spacers 12S.

Figure 2:
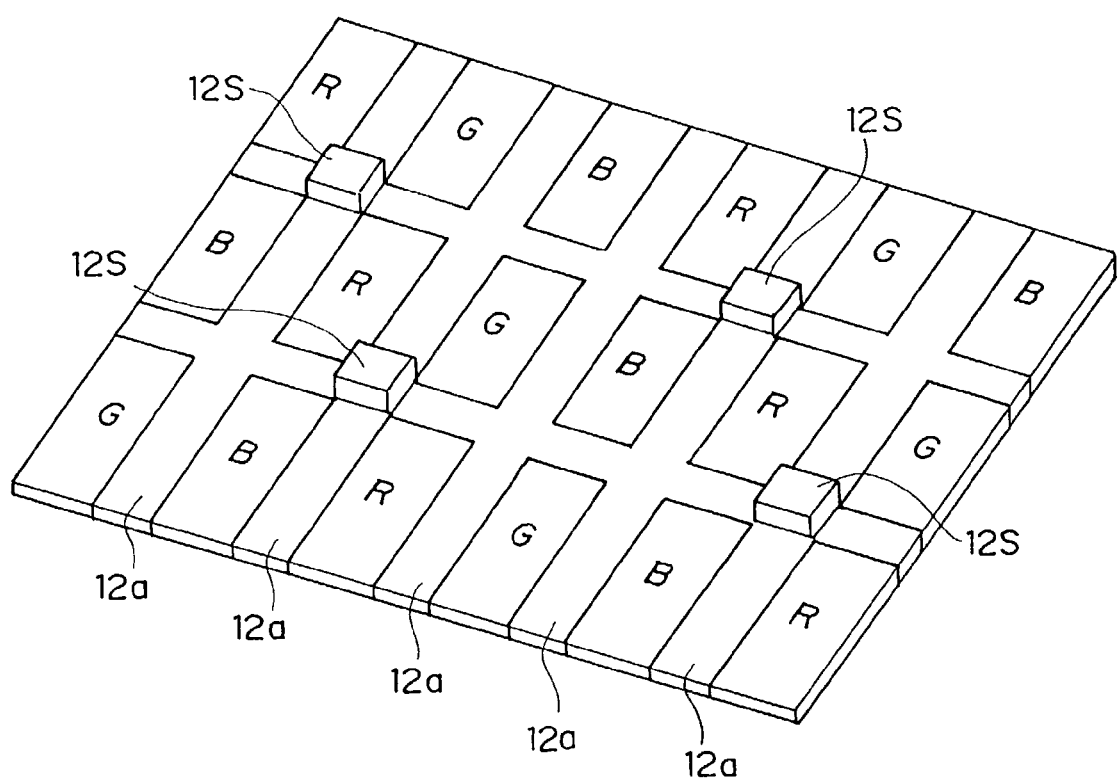
FIG. 2 is a perspective view schematically illustrating a portion of a color filter of the invention.

FIG. 2 is a schematic perspective view illustrating the black matrix. As shown in FIG. 2, the black matrix includes the light-shielding peripheries 12a of the pixels (R, G and B), and spacers 12S protruding from the light-shielding peripheries 12a. Positions at which the spacers 12S are to be provided are determined in accordance with the size of each area to be filled with liquid crystal, the difficulty in injecting liquid crystal, and the like.

The thickness (height) of the spacers 12S is determined in accordance with the desired cell gap. Accordingly, the thickness of the layer 12 provided on the surface of the substrate 10 on which the pixels have been formed depends on the thickness (height) of the spacers 12S. The typical thickness of the pixels is 1 to 3 μm. When the thickness of the pixels is less than 1 μm, higher pigment concentration of the light-shielding film is required to achieve necessary optical density, and developability is therefore lowered. When the thickness of the pixels exceeds 3 μm, developability and image reproductivity are adversely effected. The film thickness of the light-shielding film can be determined in the range described above.

The thickness (height) of the spacers 12S is larger than the thickness of the pixels and is preferably 1 to 10 μm, and more preferably 2 to 8 μm.

Accordingly, the thickness of the layer 12 is preferably 1 to 10 μm, and more preferably 2 to 8 μm. When the thickness of the layer 12 is less than 1 μm, the height of the spacers 12S becomes insufficient to fill the cell gap. When the thickness of the layer 12 exceeds 10 μm, photo-curing of the portions where the spacers 12S are to be provided becomes inadequate during exposure of the layer 12 via the photo mask 14, and the cell gap therefore becomes too large and an undesirably large amount of the liquid crystal is needed.

The same light source used to expose the entire surface exposure of the layer 12 from the substrate 10 side can be used for the pattern-exposure of the layer 12. For the developing solutions A and B for the photosensitive black resin layer, a diluted aqueous solution of an alkaline substance is typically used. A small amount of organic solvent that is compatible with water may be added to the diluted aqueous solution of the alkaline substance. Preferred examples of the alkaline substance include alkali metal hydroxides (e.g., sodium hydroxide and potassium hydroxide), alkali metal carbonates (e.g., sodium carbonate and potassium carbonate), alkali metal bicarbonates (e.g., sodium bicarbonate and potassium bicarbonate), alkali metal silicates (e.g., sodium silicate and potassium silicate), alkali metal metasilicates (e.g., sodium metasilicate and potassium metasilicate), triethanolamine, diethanolamine, monoethanolamine, morpholine, tetraalkylammonium hydroxides (e.g., tetramethylammonium hydroxide) or trisodium phosphate. The concentration of the alkaline substance in the developing solution A is 1 to 30 wt %, and the pH is preferably 8 to 14. In accordance with the properties (e.g., the acid number) of the layer 12, it is preferable to adjust the pH of the developing solution to permit removal of the uncured portions of the resin layer in the form of a film, or to permit selective dissolution of components, other than the colorant of the layer 12 (e.g., the binder or the monomer) in the developing solution. The developing solutions A and B may be the same or mutually different.

Examples of organic solvents that are compatible with water include methanol, ethanol, 2-propanol, 1-propanol, butanol, diacetone alcohol, ethylene glycol monomethyl ether, ethylene glycol monoethyl ether, ethylene glycol mono-n-buthyl ether, benzyl alcohol, acetone, methyl ethyl ketone, cyclohexanone, ε-caprolactone,γ-butyrolactone, dimethyl formamide, dimethyl acetamide, hexamethyl phospholamide, ethyl lactate, methyl lactate, ε-caprolactam and N-methyl pyrolidone. The concentration of these organic solvents is typically 0.1 to 30 wt %.

Further, known surfactant may be added to the developing solutions and concentration thereof is preferably 0.01 to 10 wt %.

The developing solutions may be used either as bath liquids or spray liquids. To remove uncured portions of the light-shielding layer 12 in a solid (preferably, a film) state, it is preferable to scrape the portions using a rotating brush or a wet sponge in the developing solution, or to utilize spraying pressure when the developing solution is sprayed. The temperature of the developing solutions is preferably room temperature to 40° C. A rinsing process may be included after development.

After being developed, the substrate 10 is heated. In particular, the substrate 10 on which the photo-cured black resin layer ("photo-cured layer") is provided is heated in an electric furnace or a dryer, by irradiating the substrate 10 using an IR lamp. The temperature and duration of heating are determined in accordance with the composition of the polymerizable composition or the thickness of the layer 12. Typically, the temperature is about 120° C. to about 250° C., and the duration is about 10 minutes to about 300 minutes to obtain sufficient solvent resistance and alkali resistance.

Hereinafter, the invention will be described specifically by way of examples. However, the invention is not limited to the same.

EXAMPLES

Example 1

Preparation of Photosensitive Black Transfer Material

A thermoplastic resin layer having a dry film thickness of 20 μm was provided on a polyethylene terephthalate film temporary support having a thickness of 100 μm, by applying and drying a solution of the formula H1 described below.

| Formula H1 | |
|---|---|
| methyl methacrylate/2-ethylhexyl acrylate/benzyl methacrylate/methacrylic acid copolymer (copolymerization composition ratio (mole ratio): 55/28.8/11.7/4.5, weight-average molecular weight: 80,000) | 15.0 parts by weight |
| BPE-500 (multifunctional acrylate; a product of Shin Nakamura Kagaku Co., Ltd.) | 7.0 parts by weight |
| F177P (fluorine-containing surfactant; a product of Dainippon Ink & Chemicals, Inc.) | 0.3 parts by weight |
| methanol | 30.0 parts by weight |
| methyl ethyl ketone | 19.0 parts by weight |
| 1-methoxy-2-propanol | 10.0 parts by weight |

Next, an intermediate layer having a dry film thickness of 1.6 μm was provided on the thermoplastic resin layer by applying and drying a solution of the formula B1 described below. Formula B1

| polyvinyl alcohol (PVA 205; a product of Kuraray Co., Ltd.; saponification ratio: 80%) | 130 parts by weight |
|---|---|
| polyvinyl pyrrolidone (PVP, K-30; a product of GAF Corporation) | 60 parts by weight |
| distilled water | 2,110 parts by weight |
| methanol | 1,750 parts by weight |

Next, a photosensitive black resin composition layer having a dry thickness of 6.5 μm was provided on the intermediate layer by applying and drying a solution of the formula C1 described below. Formula C1

| benzyl methacrylate/methacrylic acid copolymer (mole ratio: 70/30, acid number: 104 mgKOH/g, weight-average molecular weight: 30,000) | 18.1 parts by weight |
|---|---|
| 2-ethylhexyl acrylate/methacrylic acid/methyl mathacrylate/benzyl methacrylate copolymer (mole ratio: 7/15/73/5, acid number: 77 mgKOH/g, weight-average molecular weight: 80,000) | 18.9 parts by weight |
| dipentaerithritol hexaacrylate | 27.0 parts by weight |
| 2,4-bis(trichloromethyl)-6-[4-(N,N-diethoxycarbomethyl)-3-bromophenyl]-s-triazine | 1.34 parts by weight |
| carbon black (specific surface area measured by the nitrogen-adsorption method: 110 m$^2$/g, oil absorption: 49 cc/100 g) | 10.0 parts by weight |
| hydroquinone monomethyl ether | 0.02 parts by weight |
| F177P (fluorine-containing surfactant; a product of Dainippon Ink & Chemicals, Inc.) | 0.09 parts by weight |
| propylene glycol monomethyl ether acetate | 400 parts by weight |
| methyl ethyl ketone | 600 parts by weight |

A cover sheet of polypropylene (12 μm thick) was pressed on and adhered to the photosensitive black resin composition layer to obtain a photosensitive black transfer material.

A color filter with R, G and B pixels having a thickness of 2 μm was formed on a no-alkali glass substrate (0.7 mm thick). The color filter was the same as that of Example 1 of Japanese Patent Application No. 4-150691. Transmittance through the pixels B of light having a wavelength of 400 nm or more was 10% or more. After the cover sheet was removed, the photosensitive black transfer material was laminated on the R, G and B color filter with the photosensitive black resin layer side being bonded with the color filter surface by being pressed at 0.8 kg/cm$^2$ and heated at 130° C. using a laminator (VP-II; a product of Taisei Laminator Co., Ltd.). The temporary substrate was then peeled off.

Next, the entire surface of the photosensitive black resin composition layer was exposed via a frame from the opposite side of the color filter (i.e., from the transparent substrate side) using an extra-high pressure mercury lamp at 100 mJ/cm$^2$. The surface of the photosensitive black resin composition layer was pattern-exposed to light via a mask from the resin layer side at 200 mJ/cm$^2$ to form spacers. Subsequently, unnecessary portions were removed in the form of a film using a developing solution 1 (an alkaline aqueous solution of TPD2 that was diluted 10-fold; a product of Fuji Photo Film Co., Ltd.). Then, the film thickness of the obtained image was reduced only at portions that had been exposed from the back side using a developing solution 2 (an alkaline aqueous solution of TPD2 that was diluted 20-fold; a product of Fuji Photo Film Co., Ltd.). Finally, the photosensitive black resin composition layer was heated at 250° C. for 50 minutes to form light-shielding films constituting the peripheries of the R, G and B pixels, and spacers. The height of the spacers (i.e., the height from the surface of the transparent substrate) was 5.3 μm. The light-shielding films and the R, G and B layers did not overlap each other. The light-shielding films had a high optical density of 0.01 in the Y value of the CIE color system. The thickness of the light-shielding films was substantially the same as those of the R, G and B pixels.

Comparative Example 1

Light-shielding films and spacers were formed in the same manner as that of Example 1 except that the process using the developing solution 2 was omitted. The obtained light-shielding films were thicker than the R, G and B pixels. When a liquid crystal panel was produced with the obtained black matrix, undesirable liquid crystal domain occurred and it was difficult to inject liquid crystal into cells.

Example 2

Light-shielding films and spacers were formed in the same manner as that of Example 1 except that the developing solution 2 was used instead of the developing solution 1. The height of the spacers (i.e., the height from the surface of the transparent substrate) was 6.3 µm. The light-shielding films and the R, G and B layers did not overlap each other. The light-shielding films had a high optical density of 0.01 in the Y value of the CIE color system. The thickness of the light-shielding films was substantially the same as those of the R, G and B pixels.

What is claimed is:

1. A method of producing a multicolor pixel sheet having a black matrix, the method comprising the steps of:
    preparing a pixel sheet in which pixels of different colors are formed with a gap therebetween on a light-transmitting sheetlike substrate, each pixel composed of a coloring layer;
    covering upper surfaces of the pixels, the gap between the pixels, and an outer periphery defined by the outermost pixels with a photosensitive black resin layer composed of a photosensitive resin composition;
    exposing the pixel sheet to light from the side of the substrate opposite to the side disposed with the photosensitive black resin layer, to cure at least a lower portion of the photosensitive black resin layer at the gap between the pixels and at the outer periphery defined by the outermost pixels;
    exposing, via a photo mask, the pixel sheet to light from the side of the substrate disposed with the photosensitive black resin layer, to cure the photosensitive black resin layer at a part of the gap between the pixels and the outer periphery defined by the outermost pixels;
    developing the exposed pixel sheet to remove uncured portions of the photosensitive black resin layer in a first development step;
    developing the obtained pixel sheet from the first development step to reduce film thickness of the black resin layer at the gap between the pixels and the outer periphery defined by the outermost pixels in a second development step; and
    heating the pixel sheet having the developed black resin layer to further cure the black resin layer.

2. The method of claim 1, wherein developing solutions used in the developing steps are the same.

3. The method of cliam 1, wherein the photosensitive resin composition includes an alkali-soluble binder polymer, an addition-polymerizable monomer having an ethylenical unsaturated double bond, a photopolymerization initiator and a black colorant, and the alkali-soluble binder polymer has an acid number of 50 to 300 mgKOH/g and a weight-average molecular weight of 1,000 to 300,000.

4. The method of cliam 2, wherein the photosensitive resin composition includes an alkali-soluble binder polymer, an addition-polymerizable monomer having an ethylenical unsaturated double bond, a photopolymerization initiator and a black colorant, and the alkali-soluble binder polymer has an acid number of 50 to 300 mgKOH/g and a weight-average molecular weight of 1,000 to 300,000.

5. The method of cliam 1, wherein the step of covering upper surfaces of the pixels, the gap between the pixels, and an outer periphery defined by the outermost pixels with a photosensitive black resin layer composed of a photosensitive resin composition is conducted by a transferring method.

6. The method of cliam 2, wherein the step of covering upper surfaces of the pixels, the gap between the pixels, and an outer periphery defined by the outermost pixels with a photosensitive black resin layer composed of a photosensitive resin composition is conducted by a transferring method.

7. The method of cliam 3, wherein the step of covering upper surfaces of the pixels, the gap between the pixels, and an outer periphery defined by the outermost pixels with a photosensitive black resin layer composed of a photosensitive resin composition is conducted by a transferring method.

8. A color filter produced by the method according to cliam 1.

9. A color filter produced by the method according to cliam 2.

10. A color filter produced by the method according to cliam 3.

11. A color filter produced by the method according to cliam 5.

* * * * *